(12) United States Patent
Moon et al.

(10) Patent No.: US 6,888,417 B2
(45) Date of Patent: May 3, 2005

(54) VOLTAGE CONTROLLED OSCILLATOR

(75) Inventors: Yongsam Moon, Cupertino, CA (US); Gijung Ahn, Sunnyvale, CA (US); Deog-Kyoon Jeong, Seoul (KR)

(73) Assignee: Silicon Image, Inc., Sunnyvale, CA (US)

(*) Notice: Subject to any disclaimer, the term of this patent is extended or adjusted under 35 U.S.C. 154(b) by 0 days.

(21) Appl. No.: 10/613,442

(22) Filed: Jul. 3, 2003

(65) Prior Publication Data

US 2004/0051597 A1 Mar. 18, 2004

Related U.S. Application Data

(63) Continuation of application No. 10/356,695, filed on Jan. 30, 2003, which is a continuation of application No. 10/305,254, filed on Nov. 25, 2002, which is a continuation-in-part of application No. 09/948,123, filed on Sep. 5, 2001, now abandoned.
(60) Provisional application No. 60/333,439, filed on Nov. 26, 2001.

(51) Int. Cl.[7] .............................. H03B 5/00; H03F 3/45
(52) U.S. Cl. .............................. 331/75; 331/57; 331/74; 330/252; 330/253; 375/376
(58) Field of Search .......................... 331/1 A, 10–12, 331/14–18, 25, DIG. 2, 57, 74, 75; 327/39–43, 156–159, 266, 274, 280, 287, 563; 330/252, 253; 375/376; 455/260

(56) References Cited

U.S. PATENT DOCUMENTS 5,966,030 A * 10/1999 Schmitt et al. ................ 326/83

OTHER PUBLICATIONS

Lee, C. Yoo, W. Kim, S. Chai, and W. Song, "A 622Mb/s CMOS Clock Recovery PLL with Time–Interleaved Phas Detector Array," in *IEEE ISSCC Dig. Tech Papers*, Feb. 1996, pp. 198–199.

Fiedler, R. Mactaggart, J. Welch, and S. Krishnan, "A 1.0625 Gbps Transceiver with 2×–Oversampling and Transmit Signal Pre–Emphasis," in *IEEE ISSC Dig. Tech. Papers*, Feb. 1997, pp. 238–239.

R. Gu, J. M. Tran, H.–C. Lin, A.–L. Yee, and M. Izzard, "A 0.5–3.5Gb/s Low–Power Low–Jitter Serial Data CMOS Transceiver," in *IEEE ISSCC Dig. Tech. Papers*, Feb. 1999, pp. 352–353.

T. H. Lee, K. S. Donnelly, J. T. C. Ho, J. Zerbe, M. G. Johnson, and T. Ishikawa, "A 2.5 V CMOS Delay–Locked Loop for an 18 Mbit, 500 Megabyte/s DRAM," *IEEE J. Solid–State Circuits*, vol. 29 (Dec. 1994), pp. 1491–1496.

Efendovich, Y. Afek, C. Sella, and Z Bikowsky, "Multifrequency Zero–Jitter Delay–Locked Loop," *IEEE J. Solid–State Circuits*, vol. 29, No. 1 (Jan. 1994), pp. 26–70.

S. Sidiropoulos, and M. A. Horowitz, "A Semi–Digital Dual Delay–Locked Loop," *IEEE J. Solid–State Circuits*, vol. 32, No. 11, (Nov. 1997), pp. 1683–1692.

Y. Moon, J. Choi, K. Lee, D.–K. Jeong, and M.–K Kim, "An All–Analog Multiphase Delay–Locked Loop Using a Replica Delay Line for Wide–Range Operation and Low–Jitter Performance," *IEEE J. Solid–State Circuits*, vol. 35, (Mar. 2000), pp. 377–384.

Ian A. Young, J. K. Greason, and K. L. Wong, "A PLL Clock generator with 5 to 100 MHz of Lock Range for Microprocessors", *IEEE Journal of Solid–State Circuits*, vol. SC–27, (Nov. 1992), pp. 1599–1607.

* cited by examiner

*Primary Examiner*—David Mis
(74) *Attorney, Agent, or Firm*—Perkins Coie LLP

(57) ABSTRACT

A folded starved inverter differential output apparatus for use in a voltage controlled oscillator includes a first polarity of two transistors that are cross-coupled and a second polarity of four transistors. Also included are two inverter gates and a supply regulator.

20 Claims, 12 Drawing Sheets

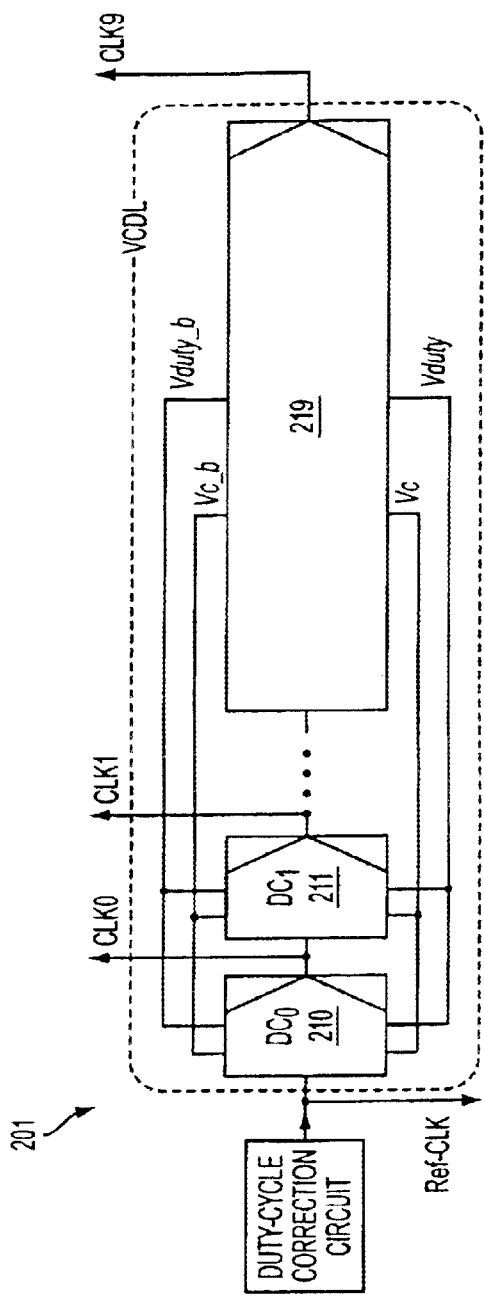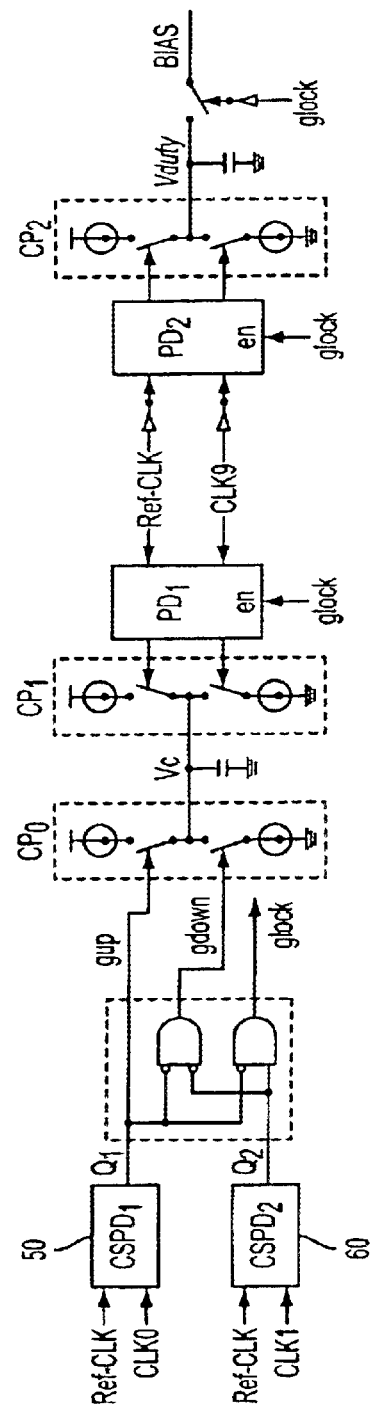
FIG. 5A
FIG. 5B

VOLTAGE CONTROLLED OSCILLATOR

CROSS REFERENCE TO RELATED APPLICATIONS

This application is a continuation of co-pending U.S. patent application entitled "Frequency Comparator With Hysteresis Between Locked And Unlocked Conditions", Ser. No. 10/356,695, filed on Jan. 30, 2003, and is incorporated herein by reference, which is a continuation of U.S. patent application entitled "0.6–2.5 Gbaud CMOS Tracked 3× Oversampling Transceiver With Dead Zone-Phase Detection for Robust Clock Data Recovery", Ser. No. 10/305,254 filed on Nov. 25, 2002 and is incorporated by reference, which claims the benefits of U.S. Provisional Patent Application entitled "0.6–2.5 Gbaud CMOS Tracked 3× Oversampling Transceiver With Dead Zone-Phase Detection for Robust Clock Data Recovery", Ser. No. 60/333,439, filed on Nov. 26, 2001, and is incorporated herein by reference. U.S. patent application entitled "Frequency Comparator With Hysteresis Between Locked And Unlocked Conditions", Ser. No. 10/356,695, filed on Jan. 30, 2003 (which the present application is a continuation of) is also a Continuation-in-Part and claims the benefits of U.S. patent application entitled "Implementing an Oversampling Transceiver with Dead-Zone Phase Detection", Ser. No. 09/948,123 filed on Sep. 5, 2001, now abandoned, which is also incorporated herein by reference.

FIELD OF THE INVENTION

The present invention relates to the field of data communications. In particular the present invention discloses methods and circuits for robust data recovery on a high-speed serial data link.

BACKGROUND OF THE INVENTION

As serial links are required to operate at higher frequencies and over longer distances, more sophisticated mechanisms have been adopted to recover data from more severely degraded signals. However, conventional serial transceiver systems have shortcomings. For example, a conventional transmitter uses a conventional current mode-driver whose speed is limited to 0.43/RC due to a passive pull-up resistor. Furthermore, if a Delay-Locked Loop (DLL) is used in a transmitter, special consideration must be made in designing a wide-range multi-phase DLL due to a so-called stuck problem.

In a conventional receiver system that uses using oversampling, the receiver Phase-Locked Loop (PLL) is locked to a reference clock rather than to the transmitted signal. In a tracked two-times (2×) oversampling receiver, two samples are made per bit, one for the data sampling and the other for edge tracking. Prior art Two-times (2×) sampling pulses are illustrated in FIG. 1B. The sampled bits are examined to determine whether to move the sampling clock phase earlier (UP) or later (DOWN). In a prior art receiver that uses two-times (2×) sampling, the decision is binary: either UP or DOWN. FIG. 1C illustrates the prior art number of UP and DOWN pulses issues 90 by a phase adjustment circuitry from the jitter of FIGS. 1A and 1B.

When a two-times (2×) sampling system has reached a locked state, the number of UP pulses is equal to the number of DOWN pulses. Thus, the phase adjustment circuitry tends to oscillate when it is in a locked steady state. Furthermore, in such a 2× sampling system, the clock edge for data sampling could be quite off from the optimum center point as illustrated in FIG. 1A. This misplacement of the sampling clock is due to the asymmetric nature of severe jitter as illustrated by the histogram in FIG. 1B, and is not desirable.

Also, a conventional tracked three-times (3×) oversampling phase detector raises several design problems due to long pumping pulses persisting for one Voltage Controlled Oscillator (VCO) cycle time. (See Inyeol Lee, et al. "A 622 Mb/s CMOS Clock Recovery PLL with Time-Interleaved Phase Detector Array," ISSCC Digest of Technical papers, pp. 198–199, February 1996.)

For better jitter performance, the Phase-Locked Loop should have a structure that is more immune to power-supply noise. The Phase-Locked Loop should also contain a smaller number of possible noise sources.

Conventional Voltage Controlled Oscillators (VCOs) that use replica bias circuits are known to produce most of their jitter due to the noise in the bias voltage from the replica circuit. (See Ian A. Young, et al., "A PLL Clock Generator with 5 to 110 MHz of Lock Range for Microprocessors,". IEEE JSSC, vol. 27, pp. 1599–1607, November 1992.). Due to these and other shortcomings of prior art transceiver systems, there is a need for an improved transceiver that provides robust clock and data recovery.

SUMMARY OF THE INVENTION

The present invention introduces a transceiver that performs three-times (3×) oversampling and dead zone detection in order to stabilize the voltage controlled oscillator (VCO) when the proper sampling frequency has been reached.

A folded starved inverter differential output apparatus for use in a voltage controlled oscillator, in accordance with an embodiment of the present invention, includes a first polarity of two transistors that are cross-coupled and a second polarity of four transistors. Also included are two inverter gates and a supply regulator.

A folded starved inverter differential output apparatus, in accordance with another embodiment of the present invention, includes two transistors cross-coupled to provide an output stage, four transistors connected to provide a folded starved inverter circuit and two inverter gates. Also included is a supply regulator; wherein the folded starved inverter differential output apparatus provides a fast slew rate, large voltage swing and symmetric output waveform.

A receiver apparatus, in accordance with a final embodiment of the present invention, includes a phase locked loop circuit that has a voltage controlled oscillator used to generate a data sampling clock signal. A data sampler is used to receive the data sampling clock signal and a folded starved inverter circuit is contained within the voltage controlled oscillator.

These and other advantages of the present invention will become apparent to those skilled in the art upon a reading of the following detailed descriptions and a study of the various figures.

BRIEF DESCRIPTION OF THE DRAWINGS

FIGS. 5A and 5B illustrates a schematic diagram of a DLL used in the present invention.

DETAILED DESCRIPTION OF THE PREFERRED EMBODIMENT

A method and apparatus for implementing an oversampling transceiver with dead-zone phase detection is disclosed. In the following description, for purposes of explanation, specific nomenclature is set forth to provide a thorough understanding of the present invention. However, it will be apparent to one skilled in the art that these specific details are not required in order to practice the present invention. For example, certain teachings of the present invention have been described with reference to a phase-locked loop circuit in a data communication transceiver device. However, the signal phase comparison and locking techniques of the present invention can easily be applied to other types of phase-locked loop applications or in other applications that require a phase comparison.

Transciever Architecture Overview

Figure 2:
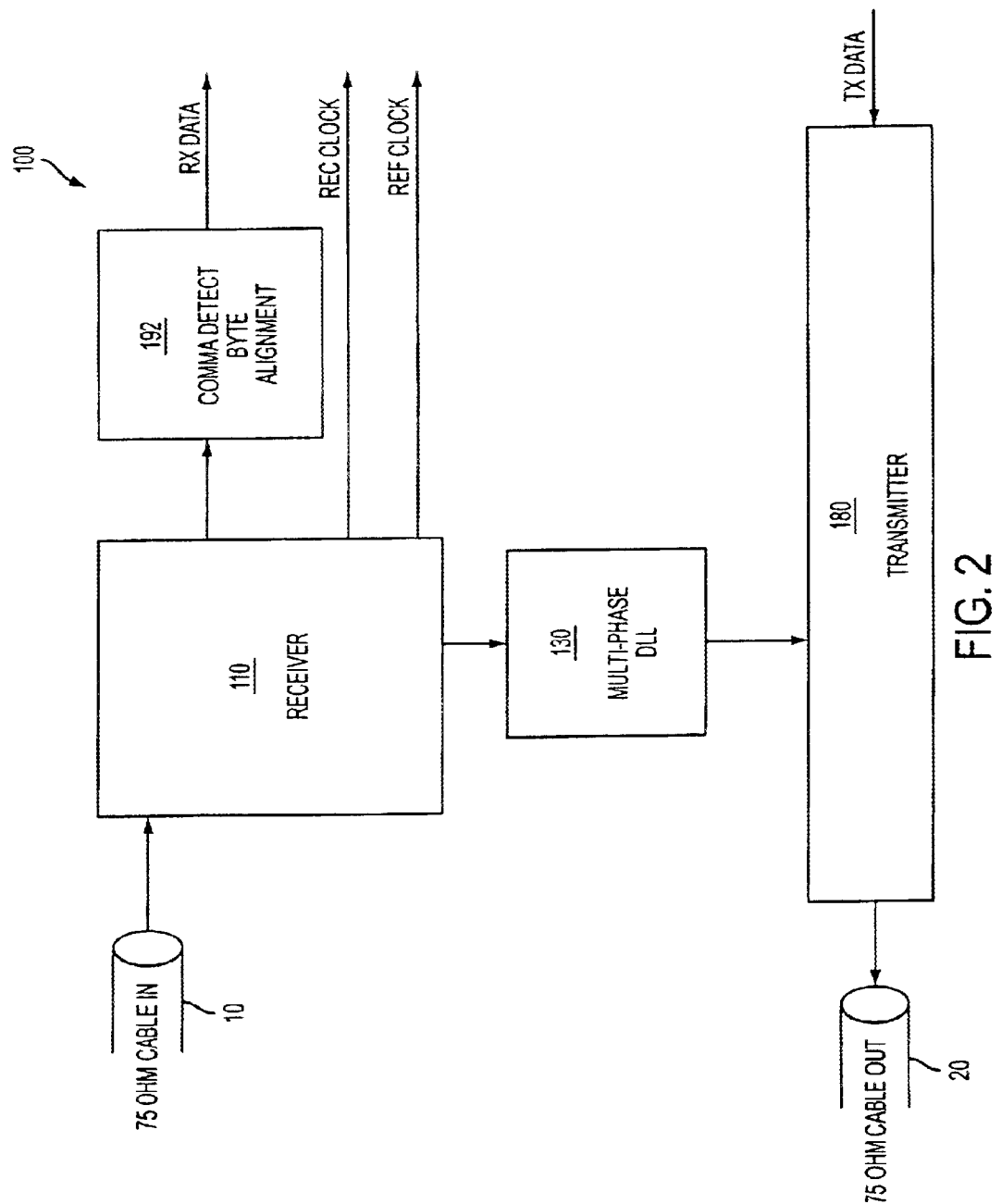
FIG. 2 illustrates a simplified block diagram of a serial link transceiver, in accordance with the present invention.

FIG. 2 illustrates a simplified block diagram of a serial link transceiver 100, in accordance with the present invention. Included is a 75 ohm cable-in 10, a receiver 100, a multi-phase DLL 130, a transmitter 180 and a 75 ohm cable-out 20. Also included is a comma detector 100.

Figure 3:
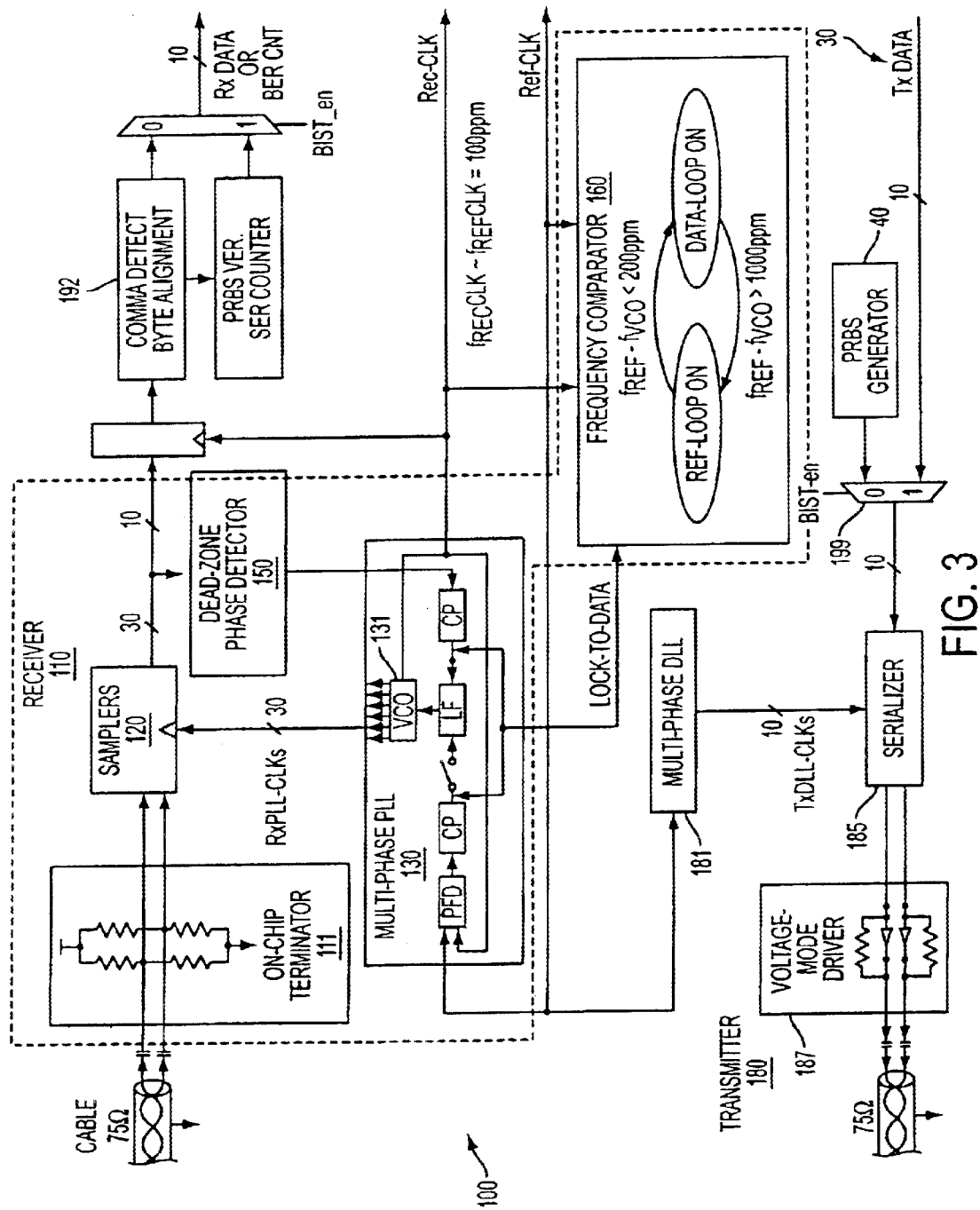
FIG. 3 illustrates a more detailed block diagram of the transceiver device, in accordance with the present invention.

FIG. 3 illustrates a more detailed block diagram of the transceiver device 100, in accordance with the present invention. The main components of the transceiver device 100 are the receiver 110 and the transmitter 180.

Transmitter Overview

The transmitter 180 of the transceiver device 100 illustrated in FIG. 3 is composed of a wide operating range multi-phase Delay-Locked Loop (DLL) 181, a serializer 185, and a voltage-mode driver 187. The voltage-mode driver 187 exhibits both active pull-up and active pull-down, and maintains its speed regardless of the cable impedance. Furthermore, the voltage-mode driver 187 can be AC coupled to a cable without any additional resistors.

A Delay-Locked Loop (DLL) 181 rather than a Phase-Locked Loop (PLL) is used in the transmitter 180 of the present invention to avoid jitter peaking which causes the jitter components near the bandwidth to be amplified rather than being suppressed when the receiver PLL has the similar bandwidth as the transmitter's. Since the Delay-Locked Loop (DLL) 181 has different frequency characteristics, such jitter peaking does not occur. The only concern is to build a Delay-Locked Loop (DLL) 181 with a wide frequency range, which will be explained below.

Receiver Overview

The receiver 110 of the transceiver device 100 illustrated in FIG. 3 is composed of on-chip termination resistor 111, oversamplers 120, a multi-phase Phase-Locked Loop (PLL) 130, a dead-zone phase detector 150, and a frequency comparator 160. The receiver Phase-Locked Loop (PLL) 130 tracks the transmitter clock frequency. Thus, clock recovery is accomplished in the Phase-Locked Loop 130.

The Voltage Controlled Oscillator 131 of the Phase-Locked Loop 130 produces a clock signal to have the oversamplers 120 sample the incoming signal at three-times (3×) the bit frequency.

While the digital Phase-Locked Loop 130 based 3× oversampling architecture has an inherent static sampling phase error up to ⅙ bit time and shows abrupt phase jump in the recovered clock due to phase quantization, the architecture of the present invention reduces such sampling error and avoids the phase jump in the presence of excessive amount of jitter in the data stream. Delay cells with a folded starved inverter configuration are used in the Voltage Controlled Oscillator (VCO) to exhibit less jitter and more tolerance against supply noise.

The dead-zone phase detector 150, of which detailed operation will be explained later, examines the sampled data and determines the direction of change for the Voltage Controlled Oscillator (VCO) 131 frequency. The dead-zone phase detector 150 is activated only after frequency lock is obtained when the external reference clock frequency and the Voltage Controlled Oscillator 131 frequency are within 200 ppm of each other.

The frequency comparator 160 is designed to have a hysteresis between its lock and unlock states in order to interact with the Phase-Locked Loop 130 in a compatible manner and to lock more robustly to the reference clock. Specifically, the frequency comparator 160 is deactivated when the external reference clock frequency and the Voltage Controlled Oscillator 131 frequency are within 200 ppm of each other, but the frequency comparator 160 is only reactivated when the external reference clock frequency and the Voltage Controlled Oscillator 131 are greater than 1000 ppm of each other.

Figure 4:
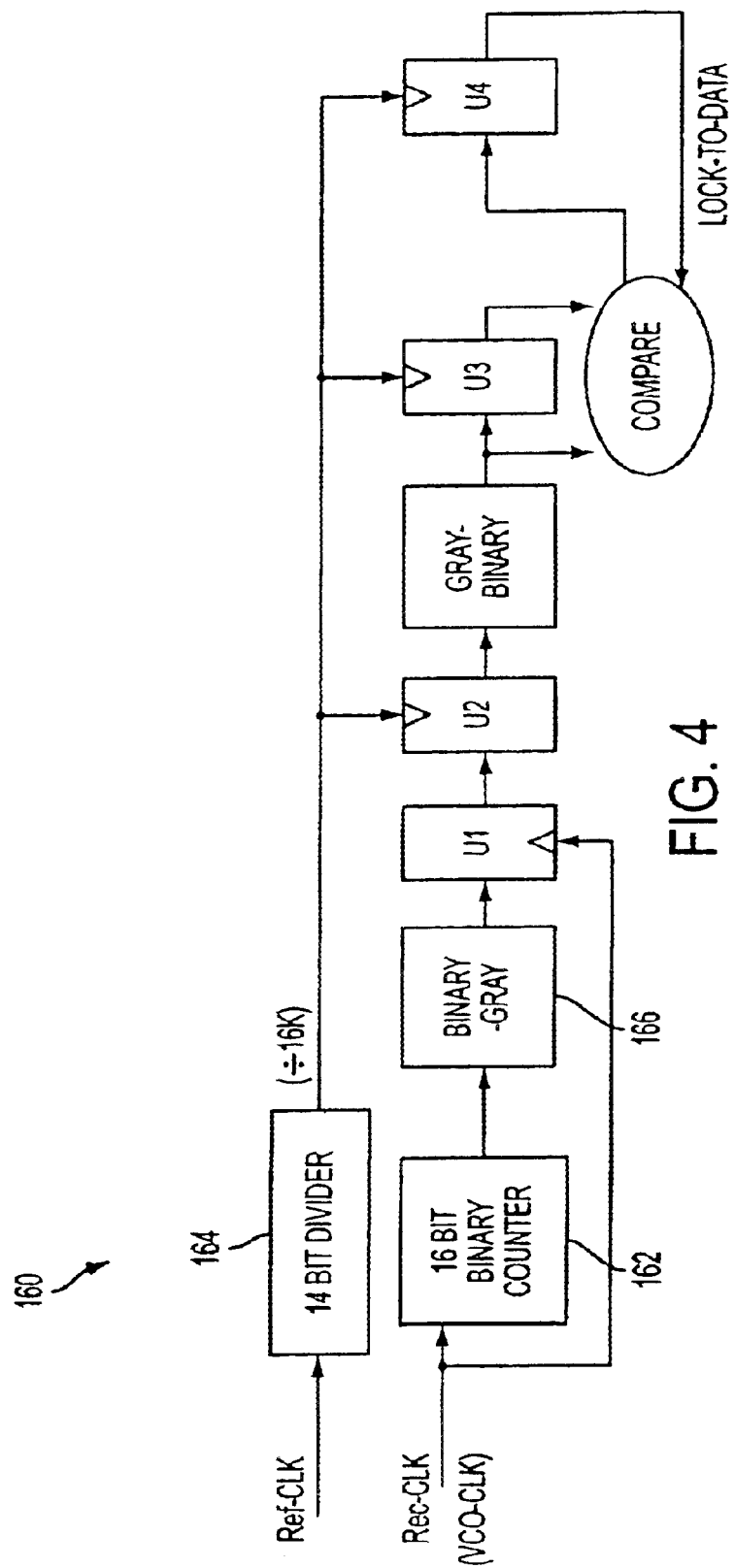
FIG. 4 illustrates a more detailed block diagram of the frequency comparator.

FIG. 4 illustrates a more detailed block diagram of the frequency comparator 160. As previously stated, the frequency comparator has hysteresis between the lock and unlock conditions. A 16-bit binary counter 162 is updated at VCO-CLK cycle. A 14 bit divider 164 divides the Ref-CLK. Latch U2 samples the binary counter value at the divided Ref-CLK ridges. However, the Ref-CLK and VCO-CLK domains are asynchronous with each other. As a result, there is a possibility that the latch U2 will fall ino meta-stability when transmitted value changes on the sampling edge of the Ref-CLK. Since some bits have been changed while others have not at the sampling time, the sampled value can possibly be very different from the original value. To prevent this meta-stability problem, a binary-to-gray code converter 166 is inserted before the latching stage to allow only one bit to be inverted whenever the counter value is updated.

Other Transceiver Circuits

Referring back to FIG. 3, a comma detector 192 in the transceiver device 100 monitors the incoming data stream 30 to search for a K28. 5 pattern in IBM 8B/10B coding for byte alignment. For ease of testing at the full speed, the transceiver device 100 includes an integrated Built-In Self Test (BIST) circuit 199. The Build-In Self Test (BIST) circuit includes Pseudo Random Bit Stream (PRBS) generation 40, verification (not shown), and Bit Error Rate (BER) counting logic (not shown).

DLL Design

FIGS. 5A-D illustrate the structure and operation of one embodiment of a Delay-Locked Loop (DLL) 181 circuit for the transceiver of FIG. 2. A new DLL architecture is shown to widen its range further in an architecture level.

FIG. 4A illustrates a Voltage-Controlled Delay Line (VCDL) circuit 201 that consists of 10 delay cell elements (210, 211, . . . 219) and generates the same number of clock outputs. FIG. 4B illustrates one possible embodiment of the internal structure of each delay cell element (210, 211, . . . 219).

For the main phase detector (PD) in FIG. 5B to work around the stuck and harmonic-lock problems, the initial $T_{VCDL}$ value should satisfy the following inequality, as shown in equation I:

$$0.5 \times T_{CLK} < T_{VCDL} < 1.5 \times T_{CLK} \quad \text{(EQUATION I)}$$

where $T_{CLK}$ is the period of the reference clock.

Figure 5C:
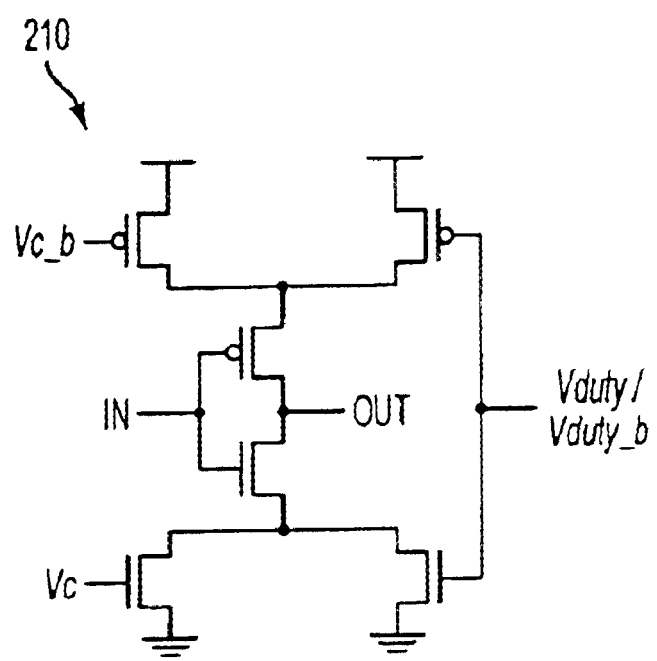
FIG. 5C illustrates a schematic diagram of a delay cell element used in the DLL of FIG. 3A.
Figure 5D:
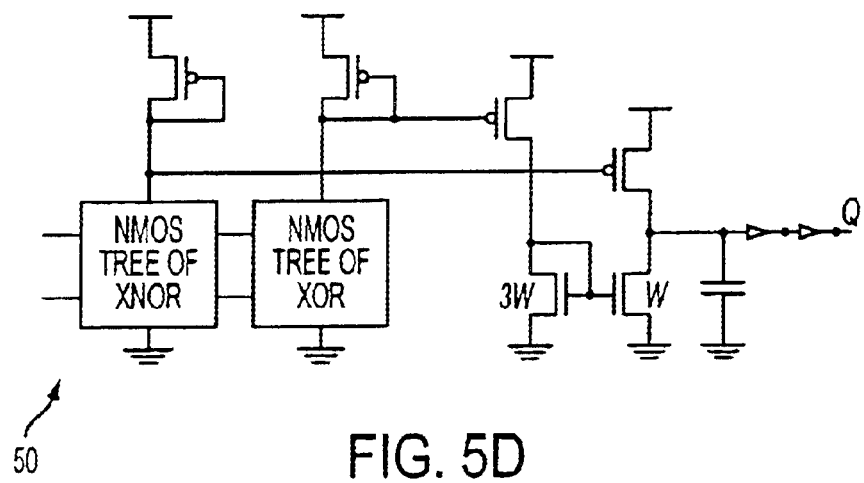
FIG. 5D illustrates a schematic diagram of a current steering phase detectors used in the DLL of FIG. 5B.

However, the range of $T_{VCDL}$ is generally wider than the above restraint and the initial value of $T_{VCDL}$ is not known at the start-up time. To put the initial $T_{VCDL}$ within the range in the preceeding inequality (equation I), two Current Steering Phase Detectors (CSPDs) 50 and 60 are used. Specifically, FIG. 5B illustrates CSPD$_1$ 50 and CSPD$_2$ 60. Since the upper to lower current ratio is tuned to 3:1 as illustrated in FIG. 5C, Ref-CLK, CLK0, and CLK1 maintain the delay relationship illustrated in the timing diagram of FIG. 5E. It can be summarized in the following inequalities, as shown in equation II:

$$T_{DC} < \tfrac{1}{8} \times T_{CLK} \text{ and } 2 \times T_{DC} > \tfrac{1}{8} \times T_{CLK} \quad \text{(Equation II)}$$

Or equivalently in terms of $T_{VCDL}$, as shown in equation III:

$$\tfrac{5}{8} \times T_{CLK} < T_{VCDL} < \tfrac{5}{4} \times T_{CLK} \text{ (therefore } T_{DC} = \tfrac{1}{10} \times T_{VCDL}) \text{(Equation III)}$$

where $T_{DC}$ is Ref-CLK to CLK0 delay and 2× $T_{DC}$ is Ref-CLK to CLK1 delay.

Figure 5E:
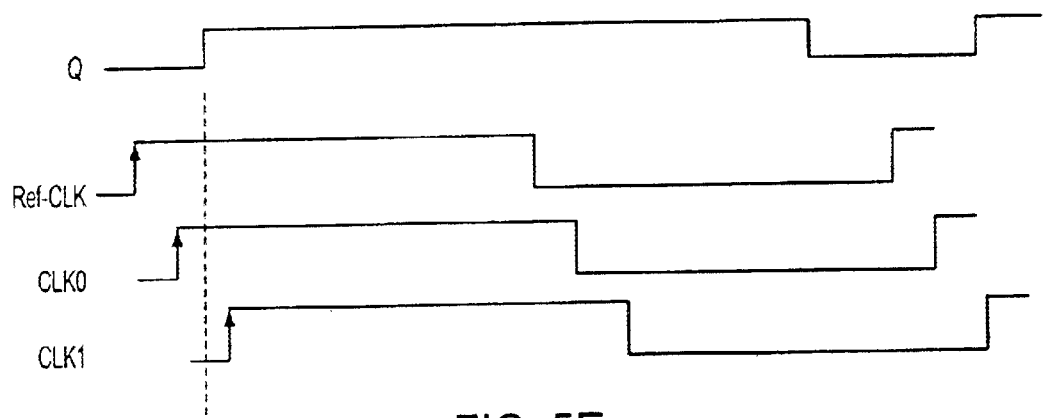
FIG. 5E illustrates a timing diagram of the clock waveforms when the DLL of FIG. 4A is in a locked state.

In such a locked state, the $Q_1$ output from CSPD$_1$ is '0' and the $Q_2$ output from CSPD$_2$ is '1' as illustrated in the timing diagram FIG. 5E. Thus, referring back to FIG. 5B, "gup" and "gdown" become '0' and "glock" become '1'. Then, CP$_0$ is disabled and PD$_1$ is activated. Since inequality (equation III) satisfies inequality (equation I) in the control hand-over, the transition is smooth and PD$_1$ removes the residual phase error between Ref-CLK and CLK9 without losing the lock.

PD$_2$ (fine phase detector) is also activated and performs cell-level duty-cycle correction. In this manner, multi-phase clocks are made equally spaced with a 50% duty-cycle. The condition for correct Current Steering Phase Detector (CSPD) operation is as follows:

$$T_{Dc.max}(=\tfrac{1}{10} \times T_{VCDL.max}) < \tfrac{1}{8} \times T_{CLK} \quad \text{(Equation IV)}$$

This inequality determines the lower bound of the Delay-Locked Loop operating range as follows:

$$\tfrac{4}{35} \times T_{VCDL.max} < T_{CLK} \leq T_{VCDL.max} \quad \text{(Equation V)}$$

Thus, the theoretical operating frequency range of the circuit is 8.75:1, which is wide enough for many applications.

Dead Zone Phase Detection

In high bandwidth communication systems over a long distance, the receiver should be able to operate in the worst case when the total jitter of the incoming data signals is less than or equal to about 40% of a bit time. The total jitter is the sum of deterministic and random jitter. The deterministic jitter includes the effect of systematic variation of bit times and Inter-Symbol Interference (ISI). The deterministic jitter generally provides the major portion of the total jitter in a long copper cable.

Figure 1A:
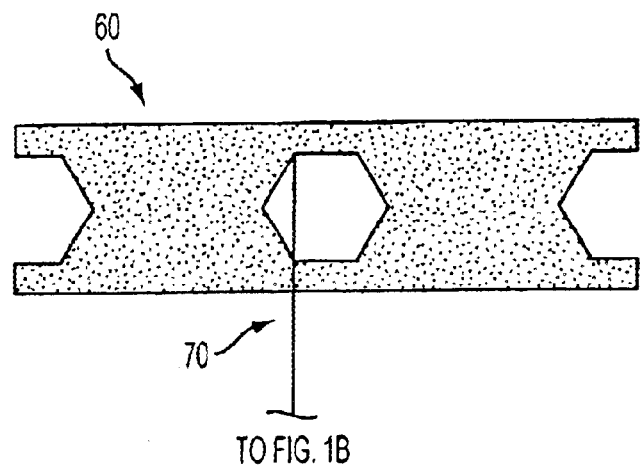
FIG. 1A illustrates a prior art eye diagram for a received signal.
Figure 6A:
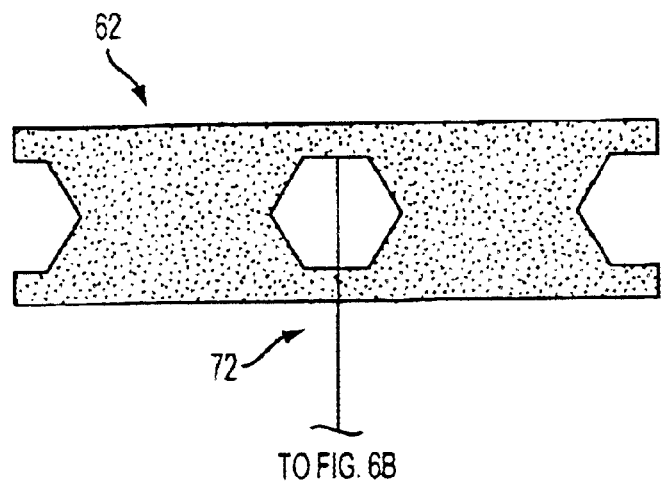
FIG. 6A illustrates an eye diagram for a received signal.

When a receiver finally receives a signal that was transmitted over a long cable, the received signal is severely degraded. One specific type of degradation is jitter, a time-based distortion of the received signal. Jitter causes the signal transition time to vary. For example, FIGS. 1A and 6A illustrate an eye diagram of a signal 60 and 62 that has been degraded by jitter. Note that there is no clean signal transition edge 70 or 74 in FIGS. 1A and 6A.

Figure 1B:
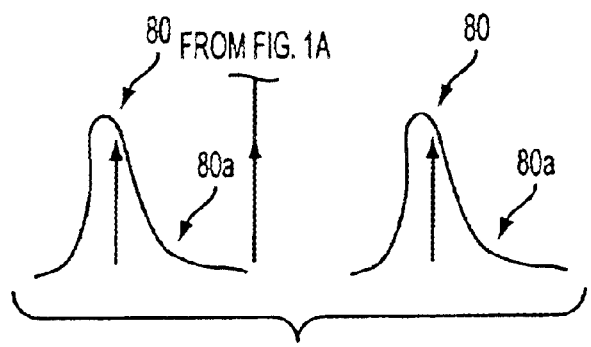
FIG. 1B illustrates a prior art asymmetric jitter distribution histogram for the signal of FIG. 1A and sampling clocks in a two-times (2×) oversampling receiver system.
Figure 1C:
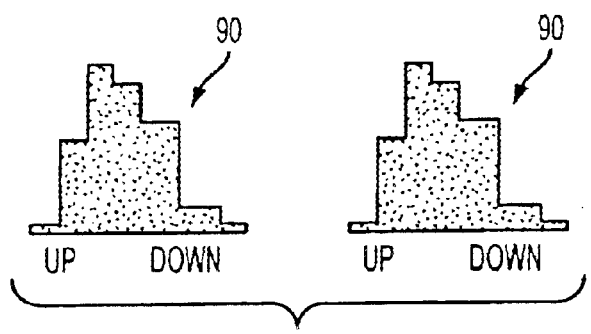
FIG. 1C illustrates the prior art UP and DOWN pulses for a Voltage Controlled Oscillator from the signal of FIG. 1A.
Figure 6B:
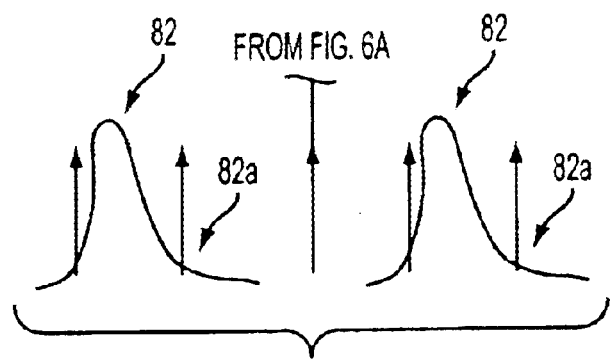
FIG. 6B illustrates an asymmetric jitter distribution histogram for the signal of FIG. 5A and sampling clocks in a three-times (3×) oversampling receiver system.

FIGS. 1B and 6B illustrate a histogram of the jitter distribution 80 and 82 of the signals 60 and 62 in FIGS. 1A and 6A, respectively. Due to systematic variation of bit times and various other reasons, the jitter histograms are often found to be asymmetric and have a longer tail 80a and 82b in one direction.

The purpose of the phase detection in a receiver circuit is to have the sampling clock located at the middle of the "data eye" in the eye diagram 60 and 62 of FIGS. 1A and 6A. This will minimize the bit error rate when recovering data from a severely degraded signal.

3× Oversampling with Dead Zone Detection

Figure 6C:
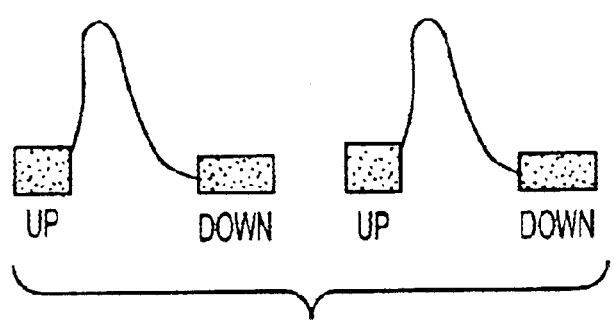
FIG. 6C illustrates the UP and DOWN pulses for a Voltage Controlled Oscillator from the signal of FIG. 6A.

The system of the present invention prevents such an oscillation at the locked state and optimizes the placement of the data-sampling clock. Specifically, the present invention introduces a tracked three-times (3×) oversampling with "dead-zone" detection. In the system of the present invention, only the extreme tail portions of the jitter histogram activate the phase adjustment circuitry. The edges located in the "dead-zone" (the middle portion of one-third of the bit time) are ignored for phase comparison. Thus, the phase adjustment circuit is active less often as illustrated in the UP and DOWN pulse diagram of FIG. 6C.

The dead-zone detection circuit may operate by comparing the bit values of two consecutive data samples and the two edge detection samples that occur between the two consecutive data samples. The following Table I provides a truth table of how the data edge bits. Table I can be viewed with reference to FIGS. 7A to 7E.

TABLE I

Figure 7A:
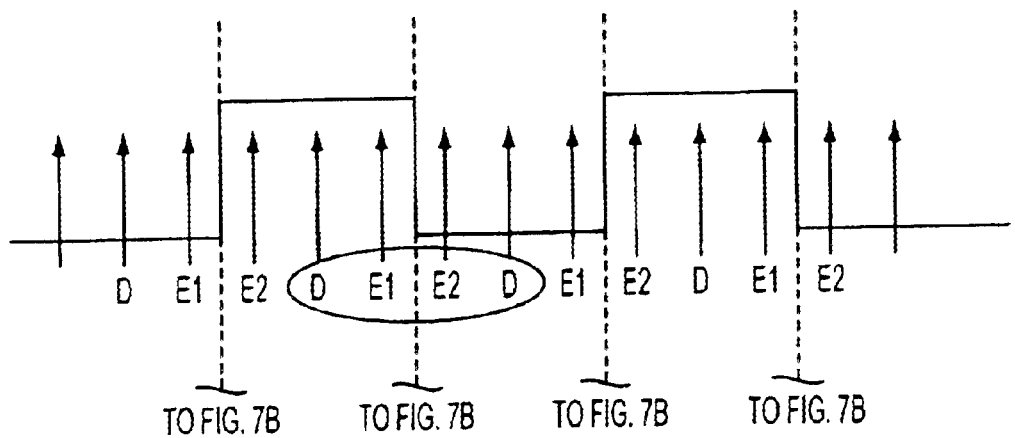
FIGS. 7A to 7E illustrate timing diagrams that cause various phase adjustments as set forth in Table 1.
Figure 7B:
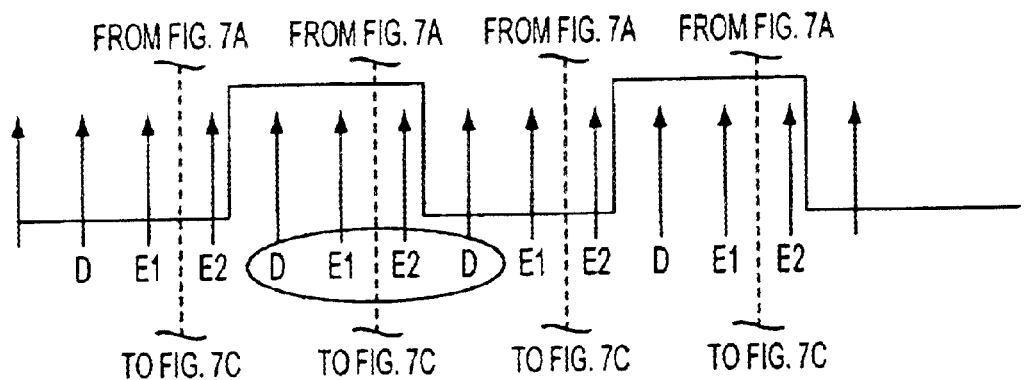
Figure 7C:
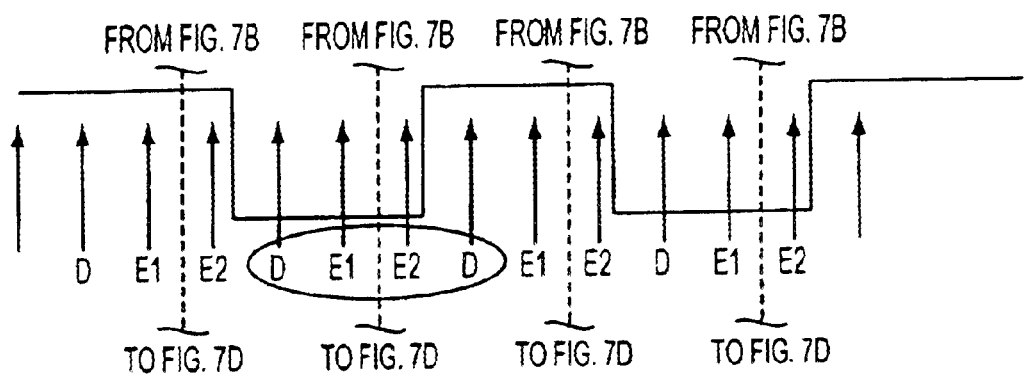
Figure 7D:
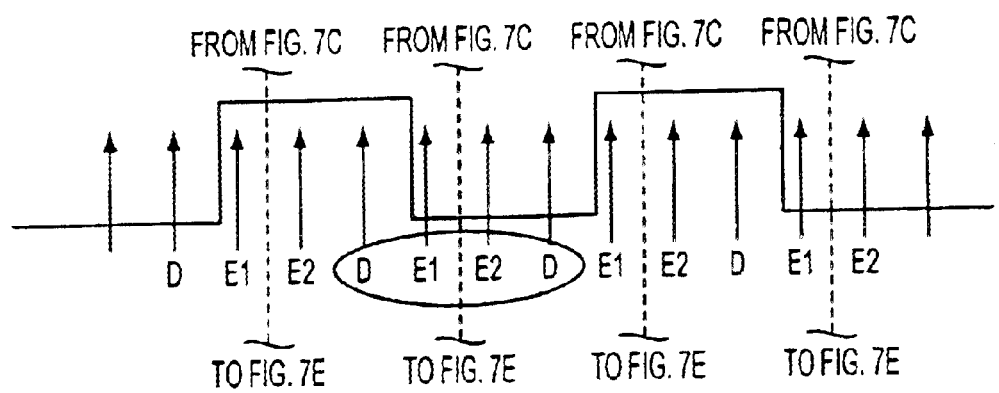
Figure 7E:
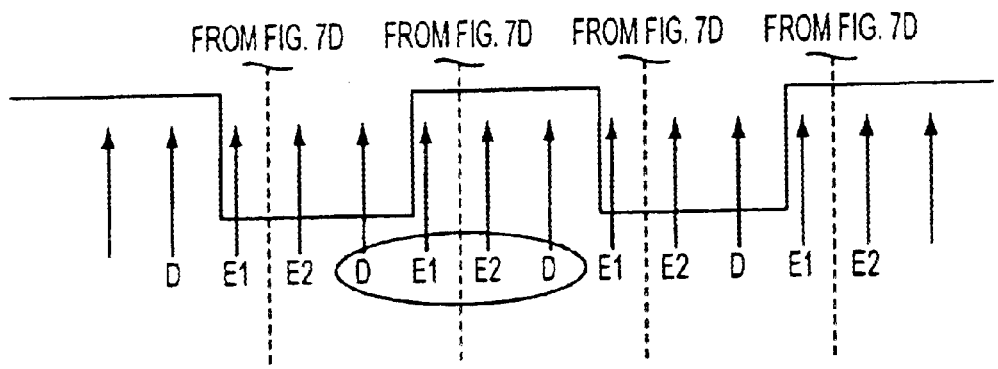

| Data N | Edge 1 | Edge 2 | Data N + 1 | Phase Adjustment | Figure |
|---|---|---|---|---|---|
| 0 | 0 | 0 | 0 | No Change (No Transition) | |
| 0 | 0 | 0 | 1 | DOWN | FIG. 7C |
| 0 | 0 | 1 | 0 | No Change (No Transition) | |
| 0 | 0 | 1 | 1 | No Change (Dead Zone) | |
| 0 | 1 | 0 | 0 | No Change (No Transition) | |
| 0 | 1 | 0 | 1 | Should not occur. | |
| 0 | 1 | 1 | 0 | No Change (No Transition) | |
| 0 | 1 | 1 | 1 | UP | FIG. 7E |

TABLE I-continued

| Data N | Edge 1 | Edge 2 | Data N + 1 | Phase Adjustment | Figure |
|---|---|---|---|---|---|
| 1 | 0 | 0 | 0 | UP | FIG. 7D |
| 1 | 0 | 0 | 1 | No Change (No Transition) | |
| 1 | 0 | 1 | 0 | Should not occur. | |
| 1 | 0 | 1 | 1 | No Change (No Transition) | |
| 1 | 1 | 0 | 0 | No Change (Dead Zone) | FIG. 7A |
| 1 | 1 | 0 | 1 | No Change (No Transition) | |
| 1 | 1 | 1 | 0 | DOWN | FIG. 7B |
| 1 | 1 | 1 | 1 | No Change (No Transition) | |

Since the data sampling points are driven toward the center of the data eye only with the worst-case edges, the operation of the 3× oversampling system with dead-zone detection is more robust in the presence of excessive jitter, where bit errors are more likely. Furthermore, the system of the present invention does better job of keeping the data sampling clock at the center of the data eye as illustrated by FIG. 6A.

Although the width of the dead-zone can be varied, simulation has proved that the dead-zone of one-third of a bit time offers quite adequate performance. Furthermore, a one-third of a bit time dead zone can be easily implemented with a 3× oversampling clock. Interestingly, the clock recovered from the data stream is expected to contain more jitter when the incoming serial data signal is clean. In such a case, the clock edges drift by up to one third of a bit time. However, the bit error rate is very low in such circumstances.

The design of the present invention reduces the pulse width to one bit time, thereby avoiding using an extremely small pumping current. Furthermore, due to the wide tolerance of the phase detection mechanism, the design of the present invention exhibits a wide frequency range operation without the pumping current control under PVT variations of PLL components.

PLL Design

Figure 8:
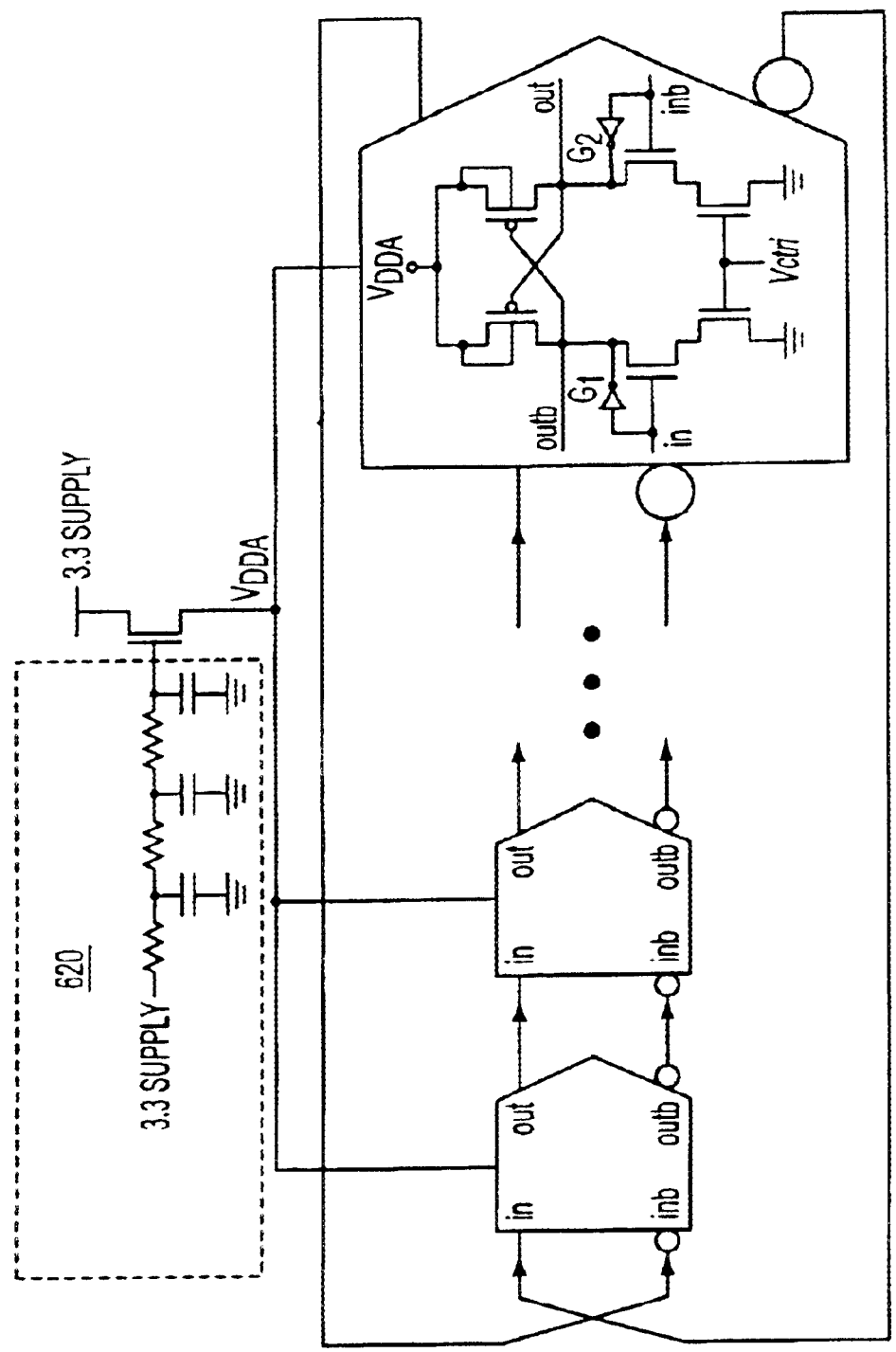
FIG. 8 is a schematic diagram of a folded starved inverter with a supply regulator used in the present invention.

FIG. 8 illustrates a schematic diagram of a folded starved inverter for use in the Voltage Controlled Oscillator (VCO) of one embodiment of the present invention. A cross-coupled PMOS. pair is included to sharpen the transition edges of the output waveform regardless of the delay time. The inverters, $G_1$ and $G_2$, give more linearity to the VCO gain and its positive supply-sensitivity compensates the negative supply-sensitivity of the starved cell.

To reduce the effect of a power supply fluctuation further, a supply regulator 620 is added. Resistors and capacitors filter out the high frequency components of the 3.3V supply and provide a clean voltage to the gate of a NMOS source follower. Simulation results show that a VCO implemented according to FIG. 8 has about 10 times smaller supply sensitivity (0.23 ps/mV) and substrate sensitivity (0.26 ps/mV) and 15 dB less phase noise than a typical VCO.

Experimental Results

A prototype chip has been fabricated with a 0.25 $\mu$m CMOS process. The DLL operating range is 30 MHz to 250 MHz with less than 2% timing error among clock phases. Board level testing shows that the transceiver operates at 2.5 GBaud over a 10-meter 150Ω Single-Twisted-Pair (STP) cable and at 1.25 GBaud over a 25 meter Single-Twisted-Pair (STP) cable with 25% eye opening with no error detected for more than 3 hours (A Bit Error Rate (BER) of less than $10^{-13}$).

Due to the operation of the dead-zone phase detection circuit 150 of the present invention, the recovered clock jitter is actually reduced as the jitter increases in the serial data signals. In an extreme case at 1.25 GBaud, recovered clock jitter is reduced down to 28 ps, RMS when the signal jitter is 111 ps, RMS. On the other hand, when there is little jitter in the serial data signal, relatively large jitter of 40 ps, RMS is observed at the receiver but without any bit error.

When the Phase-Locked Loop 130 of the receiver 110 is locked to the reference clock at 187 MHz, the measured jitter is 5.5 ps, RMS and 35 ps, peak-to-peak. The following Table II summarizes the measured performance of the transceiver circuit as implemented in 0.25 $\mu$m CMOS semiconductor process technology.

TABLE II

| | | |
|---|---|---|
| Semiconductor Process | | 0.25 $\mu$m N-well 4-metal CMOS process |
| Supply voltage | | 2.5 V (core), 3.3 V (I/O) |
| DLL frequency range | | 30–250 MHz |
| Data rate range | | 0.6–2.6 GBaud |
| Area | Total | 4.9 mm$^2$ |
| | DLL | 0.1 mm$^2$ |
| | PLL | 0.36 mm$^2$ |
| Power dissipation | Total | 57.5 (mW/GBaud) × Data rate + 125.5 (mW) (197 mW @ 1.25 GBaud, 269 mW @ 2.5 GBaud |
| | DLL | 16.8 mW @ 125 GBaud |
| | PLL | 29.4 mW @ 1.25 GBaud (6.6 mW for VCO only) |
| Accumulated Jitter | Tx data | 7.3 ps RMS/46 ps peak-to-peak |
| (with link activated) | DLL | 6.0 ps RMS/40 ps peak-to-peak |
| (@ 1.87 GBaud) | PL | 5.5 ps RMS/35 ps peak-to-peak |
| Bit Error Rate (BER) | | <10$^{-13}$ with a 10 m 150Ω Single-Twisted-Pair (STP) cable @ 2.5 GBaud |
| | | <10$^{-13}$ with a 25 m 150Ω Single-Twisted-Pair (STP) cable @ 12.5 GBaud |

The foregoing has described a method and apparatus for implementing an oversampling transceiver with dead-zone phase detection. It is contemplated that changes and modifications may be made by one of ordinary skill in the art, to the materials and arrangements of elements of the present invention without departing from the scope of the invention.

What is claimed is:

1. A folded starved inverter differential output apparatus for use in a voltage controlled oscillator comprising:
   a first polarity of two transistors cross-coupled;
   a second polarity of four transistors;
   two inverter gates; and
   a supply regulator.

2. A folded starved inverter differential output apparatus of claim 1 wherein the second polarity of four transistors are connected to perform input and control functions.

3. A folded starved inverter differential output apparatus of claim 2 wherein first polarity can be positive or negative.

4. A folded starved inverter differential output apparatus of claim 2 wherein the inverter gates provide linearity to a gain of the voltage controlled oscillator.

5. A folded starved inverter differential output apparatus of claim 2 wherein the supply regulator reduces power supply fluctuations.

6. A folded starved inverter differential output apparatus of claim 5 wherein the first polarity of cross-coupled transistors is connected to provide a differential generating output voltage.

7. A folded starved inverter differential output apparatus comprising
   two transistors cross-coupled to provide an output stage;

four transistors connected to provide a folded starved inverter circuit;

two inverter gates; and a supply regulator; wherein the folded starved inverter differential output apparatus provides a fast slew rate, large voltage swing and symmetric output waveform.

8. A folded starved inverter differential output apparatus of claim 7 wherein the cross-coupled transistors provide a differential output.

9. A folded starved inverter differential output apparatus of claim 7 wherein the inverter gates provide linearity to a gain of a voltage controlled oscillator.

10. A folded starved inverter differential output apparatus of claim 7 wherein the supply regulator reduces power supply fluctuations.

11. A folded starved inverter differential output apparatus of claim 7 wherein two of the four transistors provide an input connection.

12. A folded starved inverter differential output apparatus of claim 7 wherein two of the four transistors provide a current controlling function.

13. A receiver apparatus comprising:

a phase locked loop circuit including a voltage controlled oscillator used to generate a data sampling clock signal;

a data sampler to receive the data sampling clock signal; and a folded starved inverter circuit contained within the voltage controlled oscillator.

14. A receiver apparatus of claim 13 wherein the folded starved inverter circuit provides a delay to an input signal.

15. A receiver apparatus of claim 14 wherein the folded starved inverter circuit contains two transistors cross-coupled to provide a differential output stage.

16. A receiver apparatus of claim 15 wherein the folded starved inverter circuit contains four transistors connected to provide a folded starved inverter circuit.

17. A receiver apparatus of claim 16 wherein two of the four transistors provide an input connection.

18. A receiver apparatus of claim 17 wherein two of the four transistors provide a current controlling function.

19. A receiver apparatus of claim 18 wherein the receiver further comprises a frequency comparator.

20. A receiver apparatus of claim 19 wherein the receiver samples received data at 3 times the frequency of the data signal.

* * * * *